US009869017B2

(12) United States Patent
Tjandra et al.

(10) Patent No.: US 9,869,017 B2
(45) Date of Patent: Jan. 16, 2018

(54) H₂/O₂ SIDE INJECT TO IMPROVE PROCESS UNIFORMITY FOR LOW TEMPERATURE OXIDATION PROCESS

(71) Applicant: Applied Materials, Inc., Santa Clara, CA (US)

(72) Inventors: Agus Sofian Tjandra, San Jose, CA (US); Christopher S. Olsen, Fremont, CA (US); Emre Cuvalci, San Jose, CA (US); Lara Hawrylchak, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 127 days.

(21) Appl. No.: 14/794,355

(22) Filed: Jul. 8, 2015

(65) Prior Publication Data

US 2016/0010206 A1   Jan. 14, 2016

Related U.S. Application Data

(60) Provisional application No. 62/023,004, filed on Jul. 10, 2014.

(51) Int. Cl.
| | | |
|---|---|---|
| *C23C 16/40* | (2006.01) | |
| *C23C 16/455* | (2006.01) | |
| *C23C 16/46* | (2006.01) | |

(52) U.S. Cl.
CPC ............ *C23C 16/40* (2013.01); *C23C 16/455* (2013.01); *C23C 16/45561* (2013.01); *C23C 16/46* (2013.01)

(58) Field of Classification Search
CPC .............................. C23C 16/40; C23C 16/402
See application file for complete search history.

(56) References Cited

U.S. PATENT DOCUMENTS

| | | | | |
|---|---|---|---|---|
| 3,615,885 A | * | 10/1971 | Watson | ................... C22C 16/00 |
| | | | | 148/281 |
| 5,268,208 A | * | 12/1993 | Krisko | ................ C03C 17/3417 |
| | | | | 427/166 |
| 5,314,724 A | * | 5/1994 | Tsukune | ............ H01L 21/02126 |
| | | | | 257/E21.26 |

(Continued)

OTHER PUBLICATIONS

Hou, Kum, et al., "Uniform and enhanced field emission from chromium oxide coated carbon nanosheets". Applied Physics Letters 92, 133112 (2008), pp. 1-3.*

(Continued)

*Primary Examiner* — Bret Chen
(74) *Attorney, Agent, or Firm* — Patterson + Sheridan LLP

(57) ABSTRACT

A method for forming an oxide layer having improved thickness uniformity on a substrate is disclosed. The method includes heating a substrate disposed in a processing chamber to a temperature less than about 700 degrees Celsius, flowing a first gas mixture into the processing chamber from a first gas inlet, and flowing a second gas mixture into the processing chamber from a second gas inlet. The composition and flow rate of the second gas mixture, and the composition and flow rate of the first gas mixture are controlled so the oxide layer formed on the substrate has improved thickness uniformity.

17 Claims, 6 Drawing Sheets

(56) References Cited

U.S. PATENT DOCUMENTS

| | | | | |
|---|---|---|---|---|
| 6,124,154 | A * | 9/2000 | Miyasaka | H01L 29/66757 257/E21.134 |
| 6,156,395 | A * | 12/2000 | Zhang | C23C 16/401 427/126.3 |
| 6,242,364 | B1 * | 6/2001 | Gurer | C23C 16/30 438/758 |
| 6,616,972 | B1 * | 9/2003 | Senzaki | C23C 16/34 427/255.31 |
| 6,833,322 | B2 * | 12/2004 | Anderson | C23C 16/402 257/E21.279 |
| 8,492,292 | B2 | 7/2013 | Yokota et al. | |
| 2003/0044621 | A1 * | 3/2003 | Won | C23C 16/401 428/446 |
| 2003/0073293 | A1 * | 4/2003 | Ferro | C23C 16/4405 438/478 |
| 2004/0077184 | A1 * | 4/2004 | Anderson | C23C 16/402 438/787 |
| 2009/0232985 | A1 * | 9/2009 | Dussarrat | C23C 16/402 427/255.28 |
| 2009/0242962 | A1 * | 10/2009 | Ramkumar | H01L 21/28282 257/324 |
| 2009/0286342 | A1 * | 11/2009 | Takahashi | B82Y 20/00 438/32 |
| 2011/0049723 | A1 * | 3/2011 | Fayaz | H01L 21/76801 257/773 |
| 2011/0088763 | A1 * | 4/2011 | Le | H01L 31/03762 136/255 |
| 2014/0034632 | A1 | 2/2014 | Pan et al. | |
| 2014/0079376 | A1 | 3/2014 | Tseng et al. | |

OTHER PUBLICATIONS

Shakir, Imran, et al., "Ultra-thin and uniform coating of vanadium oxide on multiwall carbon nanotubes through solution based approach for high-performance electrochemical supercapacitors". Electrochimica Acta, 111 (2013) 400-404.*

* cited by examiner

H₂/O₂ SIDE INJECT TO IMPROVE PROCESS UNIFORMITY FOR LOW TEMPERATURE OXIDATION PROCESS

CROSS-REFERENCE TO RELATED APPLICATIONS

This application claims priority to U.S. Provisional Patent Application Ser. No. 62/023,004, filed on Jul. 10, 2014, which herein is incorporated by reference.

BACKGROUND

Field

Embodiments described herein generally relate to methods for processing substrates, more specifically, to methods for forming an oxide layer having improved thickness uniformity on a substrate.

Description of the Related Art

Oxide layers may be utilized in semiconductor devices, photovoltaic cells, light emitting diodes (LEDs) or the like as an insulating layer, such as a dielectric layer. Accordingly, oxide layers should have suitable dielectric properties and layer quality to prevent leakage between conducting layers, such as between the channel and gate of a transistor device. In one example, oxide layers thermally grown at high temperatures, e.g., greater than 700 degrees Celsius, exhibit suitable dielectric properties and layer quality. Unfortunately, reduced thermal budgets and more stringent critical dimension requirements make high temperature thermal growth processes unsuitable for advanced device nodes.

In order to meet advanced device requirements, oxide layers may be thermally grown at lower temperatures, e.g., less than 700 degrees. However, at a lower temperature, the reaction rate becomes slower, resulting in oxide layers having non-uniform thickness. Thus, there is a need in the art for improved methods for forming oxide layers.

SUMMARY

Methods for processing substrates are provided herein. More particularly, embodiments described herein provide methods for forming an oxide layer having improved thickness uniformity on a substrate.

In one embodiment, a method for forming an oxide layer on a substrate is disclosed. The method includes heating the substrate disposed in a processing chamber to a temperature less than about 700 degrees Celsius, flowing a first gas mixture into the processing chamber from a first gas inlet, and flowing second gas mixture into the processing chamber from a second gas inlet. The second gas mixture includes an oxygen containing gas and a hydrogen containing gas. The method further includes controlling a flow rate of the second gas mixture, a composition of the second gas mixture, a flow rate of the first gas mixture, a composition of the first gas mixture, and the temperature of the substrate, and forming the oxide layer on the substrate. A thickness of the oxide layer has a non-uniformity of less than one percent.

In another embodiment, a method for forming an oxide layer on a substrate is disclosed. The method includes heating the substrate disposed in a processing chamber to a temperature less than about 700 degrees Celsius, and flowing a gas mixture into the processing chamber from a first gas inlet. The first gas mixture has a flow rate of about 20 to 50 standard liters per minute. The method further includes flowing a second gas mixture into the processing chamber from a second gas inlet, and the second gas mixture includes about 30 to 70 percent oxygen gas by volume and about 30 to 70 percent hydrogen gas by volume. The second gas mixture has a flow rate of about 5 to 25 standard liters per minute. The method further includes forming the oxide layer on the substrate, and a thickness of the oxide layer has a non-uniformity of less than one percent.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally include a method for forming an oxide layer having improved thickness uniformity on a substrate. The method includes heating a substrate disposed in a processing chamber to a temperature less than about 700 degrees Celsius, flowing a first gas mixture into the processing chamber from a first gas inlet, and flowing a second gas mixture into the processing chamber from a second gas inlet. The composition and flow rate of the second gas mixture, and the composition and flow rate of the first gas mixture are controlled so the oxide layer formed on the substrate has improved thickness uniformity.

Figure 1A:
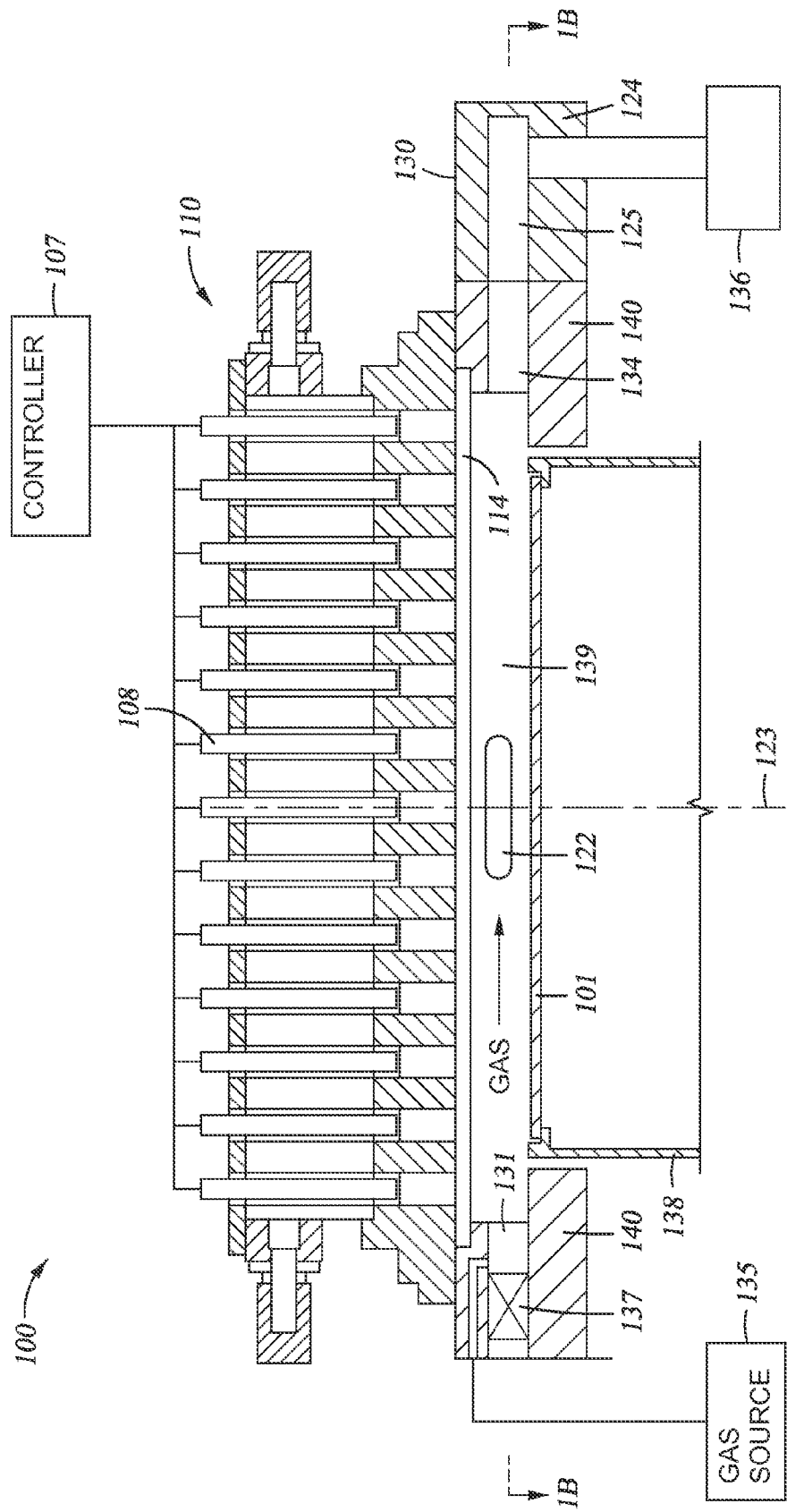
FIGS. 1A-1B illustrate a thermal processing chamber according to one embodiment described herein.

FIG. 1A is a schematic cross sectional side view of a thermal processing chamber 100 in accordance with one embodiment described herein. The thermal processing chamber 100 generally includes a lamp assembly 110, a chamber assembly 130 defining a processing volume 139, and a substrate support 138 disposed in the processing volume 139.

The lamp assembly 110 is positioned above the chamber assembly 130 and is configured to supply heat to the processing volume 139 via a quartz window 114 disposed on the chamber assembly 130. The lamp assembly 110 is configured to house a heating source 108, such as a plurality of tungsten-halogen lamps for providing a tailored infrared heating means to a substrate 101 disposed on the substrate support 138. The heating source 108 may be connected to a controller 107 which may control the energy level of the heating source 108 to achieve a uniform or tailored heating profile to the substrate 101. In one embodiment, the substrate 101 is heated to a temperature ranging from about 550 degrees Celsius to about less than 700 degrees Celsius. The heating source 108 may provide zoned heating of the substrate 101, also known as temperature tuning. Temperature tuning may be performed to change the temperature of the substrate 101 at certain locations while not affecting the rest of the substrate temperature. In one embodiment, the center of the substrate 101 is heated to a temperature that is 10 degrees Celsius to about 50 degrees Celsius higher than the temperature of the edge of the substrate 101.

A silt valve 137 may be disposed on the base ring 140 for a robot to transfer the substrate 101 into and out of the processing volume 139. The substrate 101 may be placed on the substrate support 138, which may be configured to move vertically and to rotate about a central axis 123. A gas inlet 131 adapted to a gas source 135 configured to provide one or more processing gases to the processing volume 139 may be disposed over the base ring 140. A gas outlet 134, formed on an opposite side of the base ring 140 from the gas inlet 131, is adapted to an exhaust assembly 124 which is in fluid communication with a pump system 136. The exhaust assembly 124 defines an exhaust volume 125, which is in fluid communication with the processing volume 139 via the gas outlet 134.

In one embodiment, one or more side ports 122 may be formed over the base ring 140 between the gas inlet 131 and the gas outlet 134. The side ports 122 may be connected to a side gas source configured to improve gas distribution uniformity near edge areas of the substrate 101.

Figure 1B:
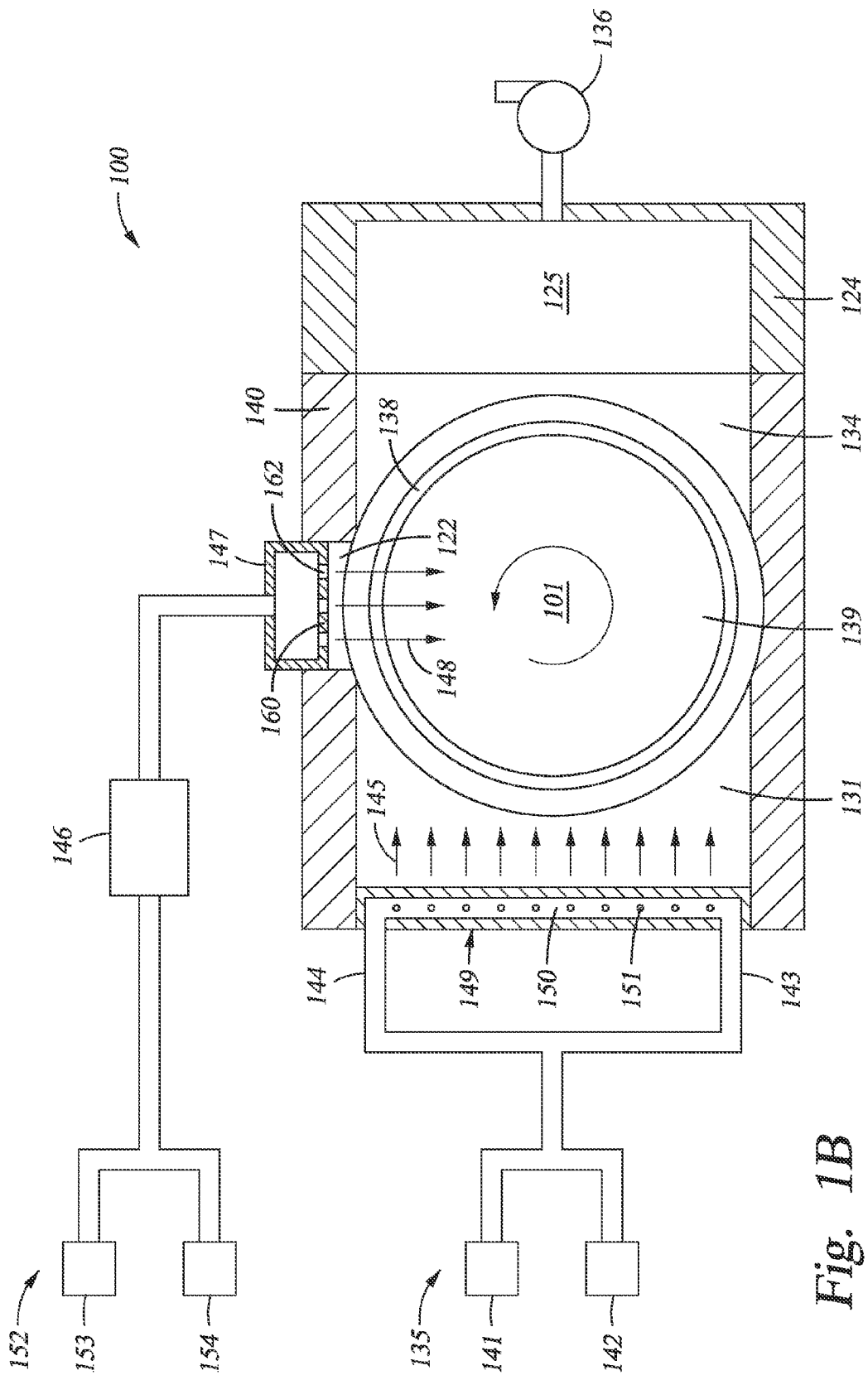

FIG. 1B is a schematic cross sectional top view of the thermal processing chamber 100 according to one embodiment described herein. As shown in FIG. 1B, the gas inlet 131 and gas outlet 134 are formed over the base ring 140 on opposite sides of the processing volume 139. Both of the gas inlet 131 and the gas outlet 134 have a width which approximates a diameter of the substrate support 138.

In one embodiment, the gas source 135 may comprise multiple gas sources, for example a first gas source 141, and a second gas source 142, each configured to provide a processing gas. Processing gases from the first gas source 141 and the second gas source 142 may mix together prior to entering an injection cartridge 149 disposed in the inlet 131. In one embodiment, the first gas source 141 provides an oxygen containing gas, such as oxygen gas, and the second gas source provides a hydrogen containing gas, such as hydrogen gas.

In one embodiment, the injection cartridge 149 has an elongated channel 150 formed therein and two inlets 143, 144 formed on opposite ends of the elongated channel 150. A plurality of injecting holes 151 are evenly distributed along the elongated channel 150 and are configured to inject a main gas flow 145 towards the processing volume 139. The two-inlet design of the cartridge 149 improves uniformity among the gas flow from each of the plurality of injecting holes 151. The main gas flow 145 may include 30 to 50 percent hydrogen gas by volume and 50 to 70 percent oxygen gas by volume, and have a flow rate ranging from about 20 standard liters per minute (slm) to about 50 slm. The flow rate is based on the substrate 101 having a 300 mm diameter, which leads to a flow rate ranging from about 0.028 slm/cm$^2$ to about 0.071 slm/cm$^2$.

Under the vacuum force from the pump system 136, the main gas flow 145 is directed from the gas inlet 131 towards the gas outlet 134. In one embodiment, the exhaust volume 125 of the exhaust assembly 124 is configured to extend the processing volume 139 to reduce the geometry influence of the chamber structure to the main gas flow 145. Particularly, the exhaust volume 125 is configured to extend the processing volume 139 along the direction of the main gas flow 145. The exhaust volume 125 may improve the uniformity of the main gas flow 145 across the processing volume 139 from the inlet 131 to the outlet 134. The pump system 136 may be also used to control the pressure of the processing volume 139. In one embodiment, the pressure inside the processing volume ranges from about 1 Torr to about 19 Torr, such as between about 5 Torr to about 15 Torr.

In one embodiment, a side injection assembly 147 is disposed over the base ring 140 so that a side gas flow 148 is provided to the processing volume 139 via the side port 122. The side injection assembly 147 is coupled to a gas source 152 via a flow adjusting device 146 configured to control a flow rate of the side gas flow 148. The gas source 152 may comprise multiple gas sources, for example a first gas source 153, and a second gas source 154, each configured to provide a processing gas. Processing gases from the first gas source 153 and the second gas source 154 may mix together prior to entering the flow adjusting device 146. In one embodiment, the side gas flow 148 may be independently controlled and may include the same gas components as the main gas flow 145. The composition and the flow rate of the side gas flow 148 are important factors in forming an oxide layer having improved thickness uniformity. The side injection assembly 147 may also include a gas distribution plate 160 having a plurality of injection holes 162. The gas distribution plate 160 may be adapted to direct the side gas flow 148 to the edge of the substrate 101, while not affecting the main gas flow 145 flowing across the center of the substrate 101. In one embodiment, the gas distribution plate 160 includes 15 injection holes.

The side gas flow 148 is configured to adjust edge and center thickness profiles of the substrate 101 being processed. In one embodiment, the side gas flow 148 increases gas exposure of the substrate 101 near the edge area. In one embodiment, the side gas flow 148 may be directed at a direction substantially perpendicular to the main gas flow 145. In one embodiment, the effect of the side gas flow 148 on the edge may be adjusted by adjusting a flow rate and composition of the side gas flow 148. In one embodiment, the side gas flow 148 includes 30 to 70 percent hydrogen gas by volume and 30 to 70 percent oxygen gas by volume, and has a flow rate ranging from about 5 slm to about 25 slm. The flow rate is based on the substrate 101 having a 300 mm diameter, which leads to a flow rate ranging from about 0.007 slm/cm² to about 0.035 slm/cm².

As discussed above, the substrate 101 typically rotates during process. The substrate 101 may be rotated along either counter clockwise or clockwise direction. The rotation of the substrate 101 may drag the side gas flow 148 away from the outlet 134 so that the side gas flow 148 may have increased effect on the substrate 101. To further increase the effect of the side flow on the substrate 101, radicals may be injected into the processing volume 139 from the side injection assembly 147. In one embodiment, a radical source (not shown) may be placed upstream of the side injection assembly 147 to generate radicals, and the side injection assembly 147 injects the radicals into the processing volume 139. The radicals introduced from the side injection assembly 147 improve the reaction rate near the edge of the substrate 101, leading to an oxide layer having improved thickness uniformity. The radical source may be a remote plasma source, a heater or any other suitable radical source.

Figure 2:
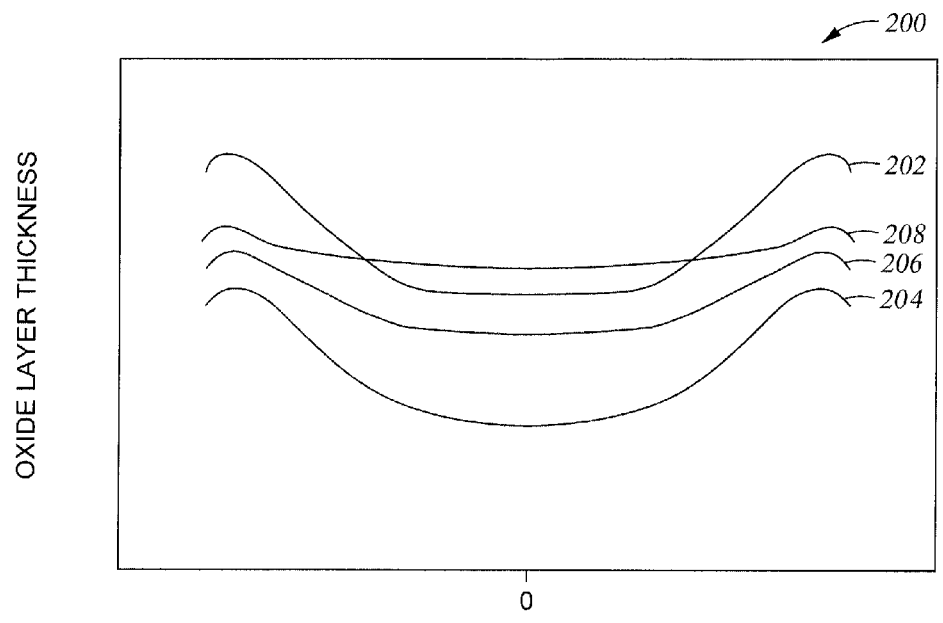
FIG. 2 is a chart showing a relationship between a radial position of a substrate and a thickness of an oxide layer disposed on a substrate according to one embodiment described herein.

FIG. 2 is a chart 200 showing a relationship between the radial position of a substrate and the thickness of an oxide layer disposed on the substrate. The substrate may be substrate 101 described in FIGS. 1A and 1B. All four oxide layers 202, 204, 206, 208 are formed under at least the following processing conditions: the substrate is heated to 600 degrees Celsius, the main gas flow includes 62 percent hydrogen and 38 percent oxygen, the side gas flow includes oxygen gas having a flow rate of about 7 slm and hydrogen gas having a flow rate of about 10 slm. No temperature tuning is performed when forming the oxide layer 202, which has the worst thickness uniformity across the substrate. During the formation of the oxide layer 204, the temperature at the edge of the substrate has been reduced by 10 degrees Celsius, resulting in improved thickness uniformity across the substrate. During the formation of the oxide layer 206, the temperature of the substrate at the center has been increased by about 25 degrees Celsius, leading to improved thickness uniformity across the substrate compared to oxide layers 202, 204. During the formation of the oxide layer 208, the temperature of the substrate at the center has been increased by about 35 degrees Celsius, leading to the best thickness uniformity across the substrate.

The oxide layer 208 has a thickness that is substantially uniform. Substantially uniform means the oxide layer 208 has a thickness non-uniformity of less than about 1 percent. Non-uniformity is calculated by dividing the standard deviation of the thicknesses across the substrate by the average thickness. As shown in FIG. 2, all four oxide layers 202, 204, 206, 208 have relatively uniform edge thickness, while the center thickness uniformity varies. Thus, having both oxygen gas and hydrogen gas in the side gas flow improves edge and center thickness uniformity, and temperature tuning further improves center thickness uniformity.

Figure 3:
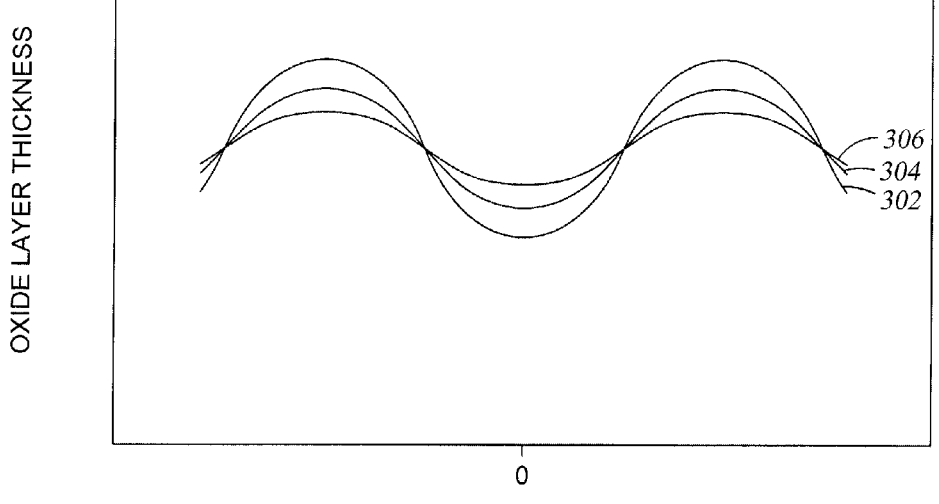
FIG. 3 is a chart showing a relationship between a radial position of a substrate and a thickness of an oxide layer disposed on a substrate according to one embodiment described herein.

FIG. 3 is a chart 300 showing a relationship between the radial position of a substrate and the thickness of an oxide layer disposed on the substrate. The substrate may be substrate 101 described in FIGS. 1A and 1B. All three oxide layers 302, 304, 306 are formed under at least the following processing conditions: the substrate is heated to 625 degrees Celsius, the main gas flow includes 40 percent hydrogen and 60 percent oxygen, the side gas flow includes only hydrogen gas, the main gas flow rate is about 40 slm, and the chamber pressure is about 8 Torr. No temperature tuning is performed when forming the oxide layer 302, which has the worst thickness uniformity across the substrate. During the formation of the oxide layer 304, the temperature at the center of the substrate has been increased by 30 degrees Celsius compared to the rest of the substrate, resulting in improved thickness uniformity across the substrate. During the formation of the oxide layer 306, the temperature of the substrate at the center has been increased by about 47 degrees Celsius, leading to improved thickness uniformity across the substrate compared to oxide layers 302 and 304. However, even with temperature tuning, the thickness of the oxide layer 306 is still less uniform than the thickness of the oxide layer 208. Thus, having both oxygen gas and hydrogen gas in the side gas flow leads to improved thickness uniformity compared to having only hydrogen gas in the side gas flow.

Figure 4:
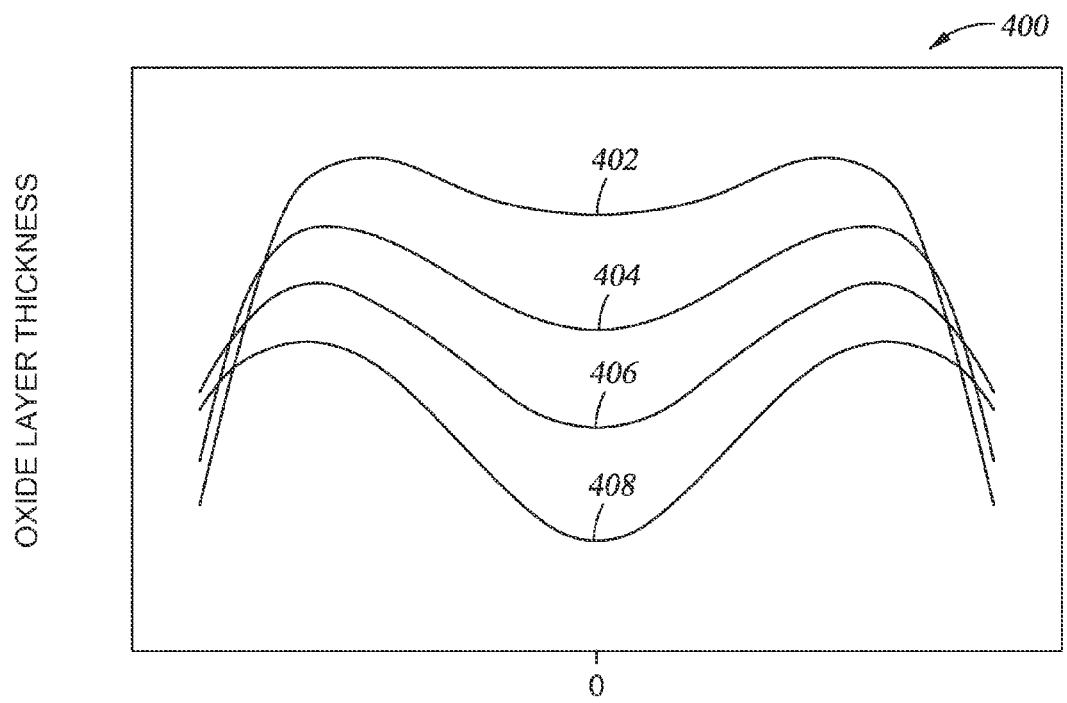
FIG. 4 is a chart showing a relationship between a radial position of a substrate and a thickness of an oxide layer disposed on a substrate according to one embodiment described herein.

FIG. 4 is a chart 400 showing a relationship between the radial position of a substrate and the thickness of an oxide layer disposed on the substrate. The substrate may be substrate 101 described in FIGS. 1A and 1B. All three oxide layers 402, 404, 406 are formed under at least the following processing conditions: the substrate is heated to 600 degrees Celsius, the main gas flow includes at least 50 percent hydrogen, and the chamber pressure is about 8 Torr. No side gas flow is introduced into the processing volume when forming the oxide layer 402, which has the worst thickness uniformity across the substrate. During the formation of the oxide layer 404, a side gas flow containing only oxygen gas is introduced into the processing volume, resulting in improved thickness uniformity at the edge of substrate. The side gas flow has a flow rate of about 3.7 slm. However, the center thickness of the oxide layer 404 is decreased. During the formation of the oxide layer 406, a side gas flow containing only oxygen gas is introduced into the processing volume, resulting in improved thickness uniformity at the edge of substrate. The side gas flow has a flow rate of about 5.5 slm. The center thickness of the oxide layer is further decreased when the flow rate of the oxygen gas side gas flow is increased. During the formation of the oxide layer 408, a side gas flow containing only oxygen gas is introduced into the processing volume, resulting in improved thickness uniformity at the edge of substrate. The side gas flow has a flow rate of about 7.5 slm. Again the center thickness of the oxide layer is further decreased when the flow rate of the oxygen gas side gas flow is increased.

Figure 5:
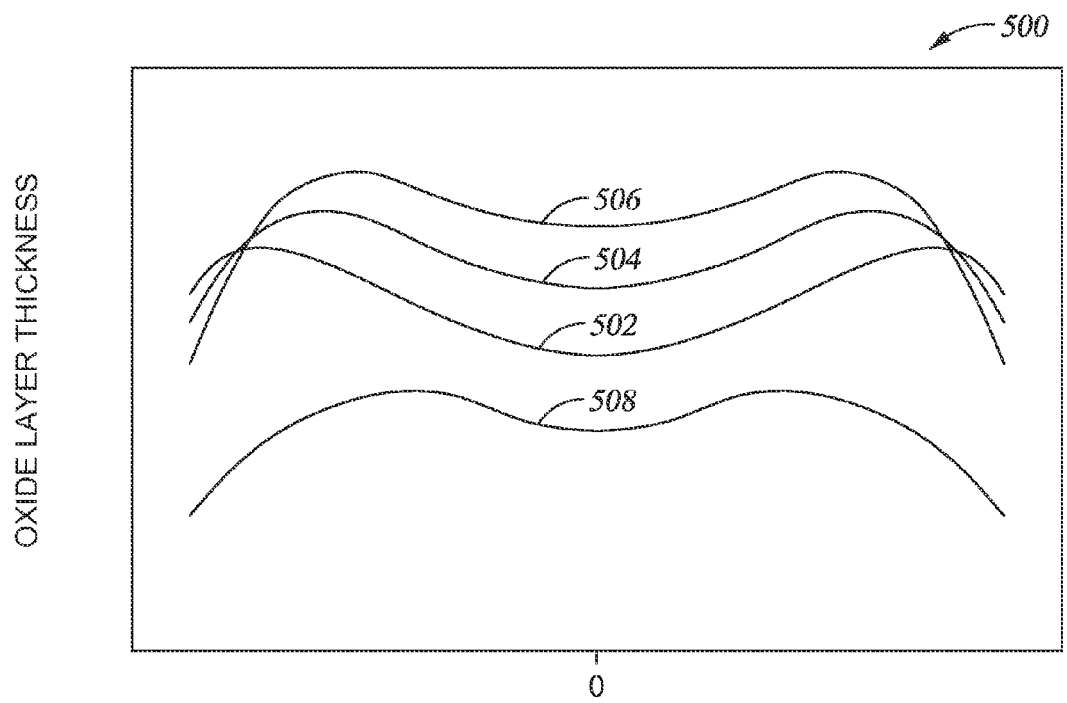
FIG. 5 is a chart showing a relationship between a radial position of a substrate and a thickness of an oxide layer disposed on a substrate according to one embodiment described herein.

FIG. 5 is a chart 500 showing a relationship between the radial position of a substrate and the thickness of an oxide layer disposed on the substrate. The substrate may be substrate 101 described in FIGS. 1A and 1B. All four oxide layers 402, 404, 406, 408 are formed under at least the following processing conditions: the substrate is heated to 600 degrees Celsius, the main gas flow includes 58 percent hydrogen and 42 percent oxygen, the main gas flow has a flow rate of about 35 slm, and the side gas flow includes only oxygen gas having a flow rate of about 5.5 slm. Oxide layers 502, 504, 506, 508 are formed under different chamber pressures. The oxide layer 502 has the best edge thickness uniformity but worst center thickness uniformity and is formed at a chamber pressure of about 8.5 Torr. The oxide layer 504 has worse edge thickness uniformity but improved center thickness uniformity and is formed at a chamber pressure of about 8.0 Torr. The oxide layer 506 has worse edge thickness uniformity but improved center thickness uniformity and is formed at a chamber pressure of about 7.5 Torr. The oxide layer 508 has the worst edge thickness uniformity but the best center thickness uniformity and is formed at a chamber pressure of about 7.0 Torr.

Based on the trend shown above, a decrease in chamber pressure may help with the center thickness uniformity while sacrificing edge thickness uniformity. However, as the chamber pressure drops to 7.0 Torr, the residence time of the gases in the processing volume is reduced, leading to a thinner oxide layer. Thus, more time may be spent on forming the oxide layer in order to reach a predetermined thickness. Thus, chamber pressure may be controlled to improve only either the edge thickness uniformity or the center thickness uniformity.

When the side gas flow only contains oxygen gas, edge thickness uniformity is improved but center growth is lowered. With the lowered center growth, the overall thickness uniformity of the oxide layer across the substrate is reduced. Therefore, having only either oxygen gas or hydrogen gas in the side gas flow does not result in forming an oxide layer having a substantially uniform thickness. Both hydrogen gas and oxygen gas should be in the side gas flow in order to improve the overall thickness uniformity of an oxide layer formed on a substrate.

Figure 6:
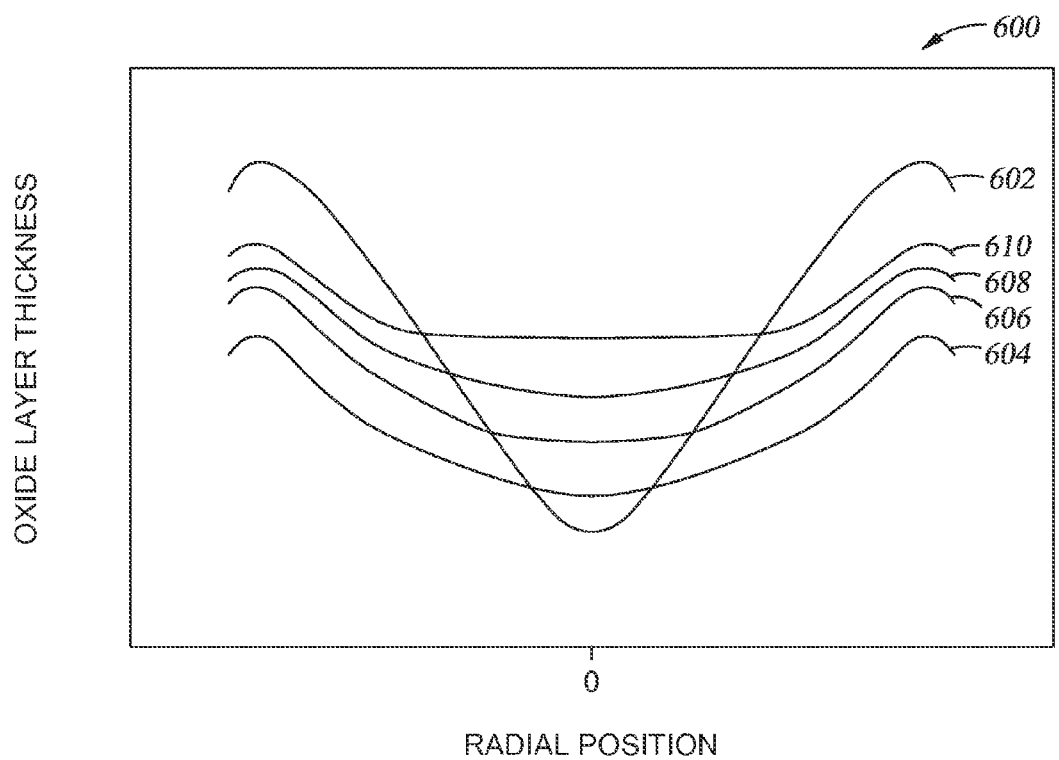
FIG. 6 is a chart showing a relationship between a radial position of a substrate and a thickness of an oxide layer disposed on a substrate according to one embodiment described herein.

To further understand the effect of the side gas flow containing both hydrogen gas and oxygen gas on the thickness uniformity of the oxide layer, the following experiments were conducted. In one experiment, a substrate is heated to 600 degrees Celsius, the main gas flow contains 62 percent hydrogen gas, the main gas flow has a flow rate of about 32 slm, and the side gas flow contains oxygen gas having a flow rate of about 7.5 slm. Hydrogen gas at various flow rates are added to the side gas flow and the results are shown in FIG. 6. FIG. 6 is a chart 600 showing a relationship between the radial position of a substrate and the thickness of an oxide layer disposed on the substrate. The substrate may be substrate 101 described in FIGS. 1A and 1B. The oxide layer 602 is formed without hydrogen gas in the side gas flow, thus showing the worst center and edge thickness uniformity. The oxide layer 604 is formed with hydrogen gas in the side gas flow, and the hydrogen gas in the side gas flow has a flow rate of about 4 slm. The oxide layer 606 is formed with hydrogen gas in the side gas flow, and the hydrogen gas in the side gas flow has a flow rate of about 6 slm. The oxide layer 608 is formed with hydrogen gas in the side gas flow, and the hydrogen gas in the side gas flow has a flow rate of about 8 slm. The oxide layer 610 is formed with hydrogen gas in the side gas flow, and the hydrogen gas in the side gas flow has a flow rate of about 10 slm.

Based on the trend shown above, an increase in the flow rate of the hydrogen gas in addition to oxygen gas in the side gas flow improves the center and edge thickness uniformity. However, the effect of increasing the hydrogen gas flow rate in the side gas flow may be reduced when the main gas flow rate is increased.

Figure 7:
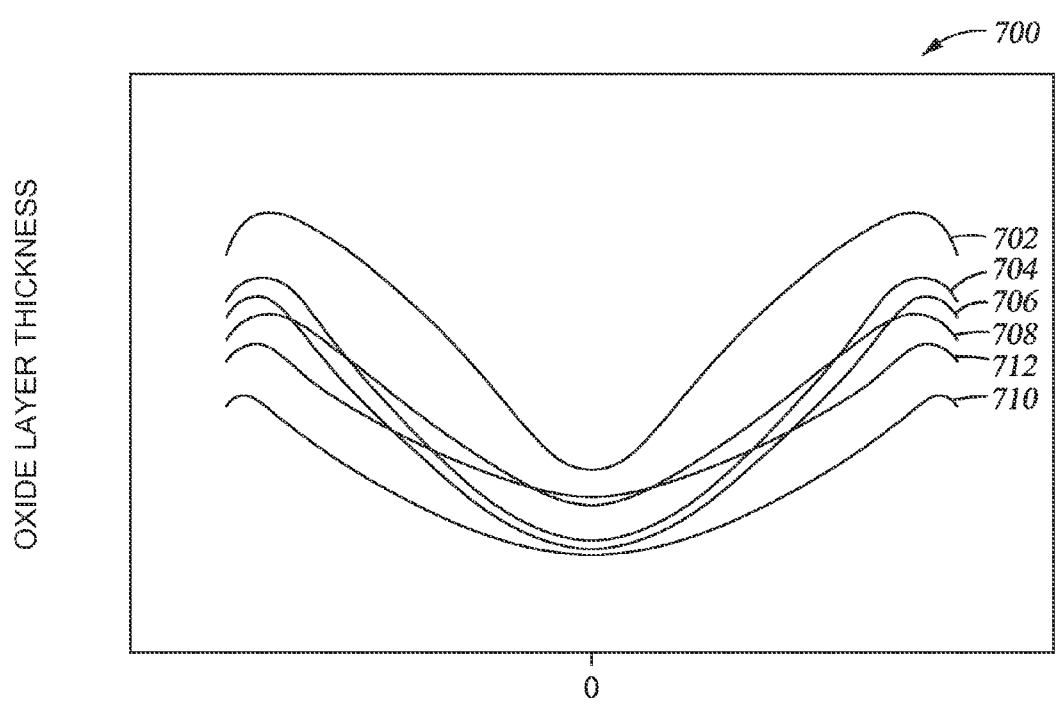
FIG. 7 is a chart showing a relationship between a radial position of a substrate and a thickness of an oxide layer disposed on a substrate according to one embodiment described herein.

In one experiment, a substrate is heated to 600 degrees Celsius, the main gas flow contains 58 percent hydrogen gas, the main gas flow has a flow rate of about 35 slm, and the side gas flow contains oxygen gas having a flow rate of about 5.5 slm. Hydrogen gas at various flow rates are added to the side gas flow and the results are shown in FIG. 7. FIG. 7 is a chart 700 showing a relationship between the radial position of a substrate and the thickness of an oxide layer disposed on the substrate. The substrate may be substrate 101 described in FIGS. 1A and 1B. The oxide layer 702 is formed without hydrogen gas in the side gas flow. The oxide layer 704 is formed with hydrogen gas in the side gas flow, and the hydrogen gas in the side gas flow has a flow rate of about 2 slm. The oxide layer 706 is formed with hydrogen gas in the side gas flow, and the hydrogen gas in the side gas flow has a flow rate of about 4 slm. The oxide layer 708 is formed with hydrogen gas in the side gas flow, and the hydrogen gas in the side gas flow has a flow rate of about 8 slm. The oxide layer 710 is formed with hydrogen gas in the side gas flow, and the hydrogen gas in the side gas flow has a flow rate of about 10 slm. The oxide layer 712 is formed with hydrogen gas in the side gas flow, and the hydrogen gas in the side gas flow has a flow rate of about 12 slm.

As shown in FIG. 7, the center thickness uniformity starts improving after the hydrogen gas flow rate in the side gas flow is increased to 10 slm (oxide layer 710), and at a higher flow rate of 12 slm for the hydrogen gas in the side gas flow, the thickness of the oxide layer 712 at the center is still not as uniform as the thickness of the oxide layer 610 at the center.

Figure 8:
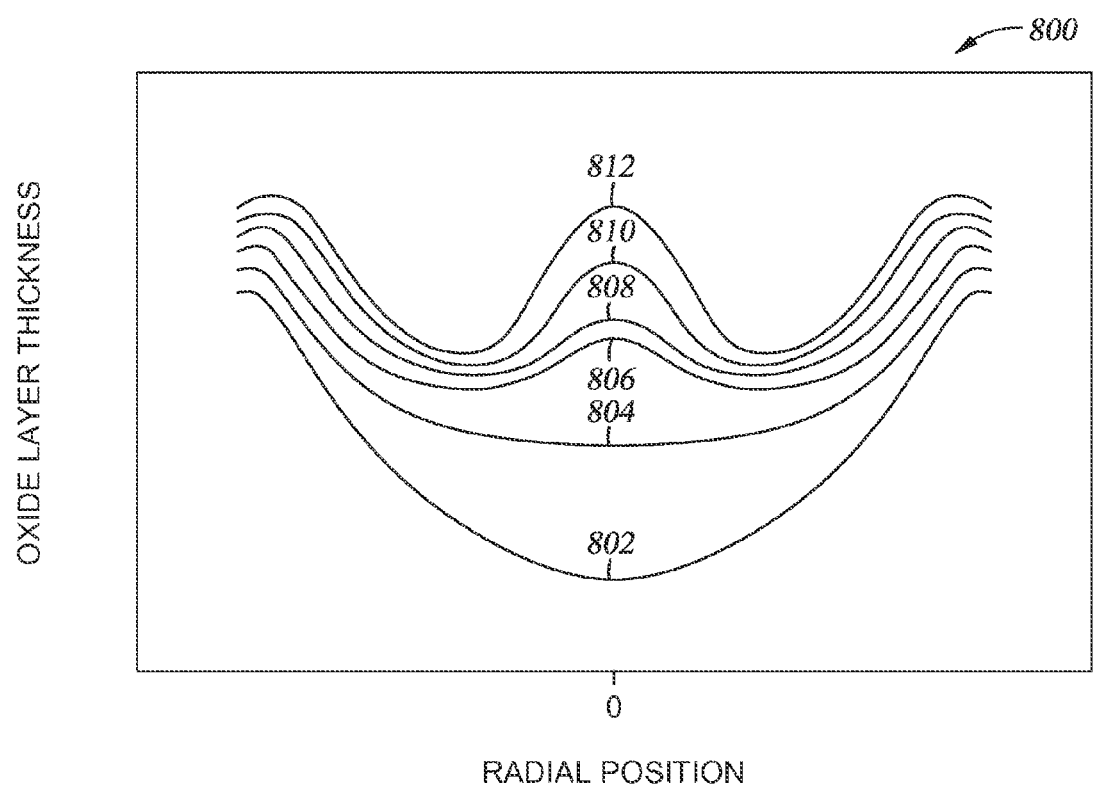
FIG. 8 is a chart showing a relationship between a radial position of a substrate and a thickness of an oxide layer disposed on a substrate according to one embodiment described herein.

By having both hydrogen gas and oxygen gas in the side gas flow, the center thickness uniformity of the oxide layer is improved since the hydrogen gas in addition to oxygen gas in the side gas flow helps improving center growth of the oxide layer. However, too much center growth may reduce center thickness uniformity. FIG. 8 illustrates an example of center thickness uniformity reduced by increased center growth.

FIG. 8 is a chart 800 showing a relationship between the radial position of a substrate and the thickness of an oxide layer disposed on the substrate. The substrate may be substrate 101 described in FIGS. 1A and 1B. All six oxide layers 802, 804, 806, 808, 810, 812 are formed under at least the following processing conditions: the substrate is heated to 600 degrees Celsius, the main gas flow includes 39 percent hydrogen and 61 percent oxygen, the main gas flow has a flow rate of about 20 slm, and the side gas flow includes only oxygen gas having a flow rate of about 7.0 slm. The oxide layer 802 is formed without the addition of hydrogen gas in the side gas flow. The oxide layer 804 is formed with the addition of hydrogen as in the side gas flow, and the hydrogen gas in the side gas flow has a flow rate of about 4 slm. The oxide layer 806 is formed with the addition of hydrogen as in the side gas flow, and the hydrogen gas in the side gas flow has a flow rate of about 8 slm. The oxide layer 808 is formed with the addition of hydrogen as in the side gas flow, and the hydrogen gas in the side gas flow has a flow rate of about 10 slm. The oxide layer 810 is formed with the addition of hydrogen as in the side gas flow, and the hydrogen gas in the side gas flow has a flow rate of about 12 slm. The oxide layer 812 is formed with the addition of hydrogen as in the side gas flow, and the hydrogen gas in the side gas flow has a flow rate of about 14 slm.

As shown in FIG. 8, when the main gas flow contains over 60 percent oxygen, an increase in the hydrogen flow rate in the side gas flow increases the center growth such that the thickness profile changes from "V" shape to "W" shape, which also reduces thickness uniformity.

In summary, methods for forming an oxide layer on a substrate are disclosed. The methods include flowing a first gas mixture into a processing chamber from a first gas inlet, and flowing a second gas mixture into a processing chamber from a second gas inlet. The composition and flow rate of the second gas mixture, the composition and the flow rate of the first gas mixture, and the temperature of the substrate may be controlled to form the oxide layer having a substantially uniform thickness.

While the foregoing is directed to embodiments, other and further embodiments may be devised without departing from the basic scope thereof, and the scope thereof is determined by the claims that follow.

The ivention claimed is:

1. A method for forming an oxide layer on a substrate, comprising:

heating the substrate disposed in a processing chamber, wherein an edge of the substrate has a first temperature that is less than a second temperature at a center of the substrate;

flowing a first gas mixture into the processing chamber from a first side gas inlet;

flowing a second gas mixture into the processing chamber from a second side gas inlet, wherein the second gas mixture includes an oxygen containing gas and a hydrogen containing gas;

controlling a flow rate of the second gas mixture, a composition of the second gas mixture, a flow rate of the first gas mixture, and a composition of the first gas mixture, wherein the second gas mixture includes oxygen gas and hydrogen gas, and has about 30 to 70 percent oxygen gas by volume and about 30 to 70 percent hydrogen gas by volume; and forming the oxide layer on the substrate by an oxidation process, wherein a thickness of the oxide layer has a non-uniformity of less than one percent.

2. The method of claim 1, wherein the first gas mixture includes a hydrogen containing gas and an oxygen containing gas.

3. The method of claim 2, wherein the first gas mixture has a flow rate of about 0.028 to 0.071 slm/cm$^2$.

4. The method of claim 3, wherein the second gas mixture has a flow rate of about 0.007 to 0.035 slm/cm$^2$.

5. The method of claim 4, wherein the hydrogen gas of the second gas mixture has a flow rate of less than about 10 standard liters per minute and the substrate has a diameter of about 300 mm.

6. The method of claim 1, wherein the processing chamber has a chamber pressure of about 1 to 19 Torr.

7. The method of claim 6, wherein the processing chamber has a chamber pressure of about 5 to 15 Torr.

8. The method of claim 1, wherein the center of the substrate is heated to the second temperature that is about 10 to 50 degrees Celsius higher than the first temperature of the edge of the substrate.

9. The method of claim 1, wherein the substrate is rotating during the forming of the oxide layer.

10. A method for forming an oxide layer on a substrate, comprising:

heating the substrate disposed in a processing chamber, wherein an edge of the substrate has a first temperature that is less than a second temperature at a center of the substrate;

flowing a first gas mixture into the processing chamber from a first side gas inlet, wherein the first gas mixture has a flow rate of about 0.028 to 0.071 slm/cm$^2$;

flowing a second gas mixture into the processing chamber from a second side gas inlet, wherein the second gas mixture includes about 30 to 70 percent oxygen gas by volume and about 30 to 70 percent hydrogen gas by volume, and wherein the second gas mixture has a flow rate of about 0.007 to 0.035 slm/cm$^2$; and forming the oxide layer on the substrate by an oxidation process, wherein a thickness of the oxide layer has a non-uniformity of less than one percent.

11. The method of claim 10, wherein the first gas mixture includes hydrogen gas and oxygen gas.

12. The method of claim 10, wherein the processing chamber has a chamber pressure of about 1 to 19 Torr.

13. A method for forming an oxide layer on a substrate, comprising:

heating the substrate disposed in a processing chamber;

flowing a first gas mixture into the processing chamber from a first side gas inlet, wherein the first gas mixture includes a hydrogen containing gas and an oxygen containing gas;

flowing a second gas mixture into the processing chamber from a second side gas inlet, wherein the second gas mixture includes an oxygen containing gas and a hydrogen containing gas;

controlling a flow rate of the second gas mixture, a composition of the second gas mixture, a flow rate of the first gas mixture, a composition of the first gas mixture, and the temperature of the substrate, wherein the first gas mixture has a flow rate of about 0.028 to 0.071 slm/cm$^2$ and the second gas mixture has a flow rate of about 0.007 to 0.035 slm/cm$^2$; and forming the oxide layer on the substrate by an oxidation process.

14. The method of claim 13, wherein the substrate is heated to a temperature ranging from about 550 degrees Celsius to about less than 700 degrees Celsius.

15. The method of claim 13, wherein a thickness of the oxide layer has a non-uniformity of less than one percent.

16. The method of claim 13, wherein the processing chamber has a chamber pressure of about 1 to 19 Torr.

17. The method of claim 13, wherein the second gas mixture includes about 30 to 70 percent oxygen gas by volume and about 30 to 70 percent hydrogen gas by volume.

\* \* \* \* \*